US011060494B2

(12) United States Patent
Mutlu

(10) Patent No.: US 11,060,494 B2
(45) Date of Patent: Jul. 13, 2021

(54) VALVE AND METHOD FOR PRODUCING A VALVE

(71) Applicant: Robert Bosch GmbH, Stuttgart (DE)

(72) Inventor: Fatima Mutlu, Sindelfingen (DE)

(73) Assignee: Robert Bosch GmbH, Stuttgart (DE)

(*) Notice: Subject to any disclaimer, the term of this patent is extended or adjusted under 35 U.S.C. 154(b) by 0 days.

(21) Appl. No.: 16/531,941

(22) Filed: Aug. 5, 2019

(65) Prior Publication Data

US 2019/0360444 A1 Nov. 28, 2019

Related U.S. Application Data

(62) Division of application No. 15/327,209, filed as application No. PCT/EP2015/067484 on Jul. 30, 2015, now Pat. No. 10,415,526.

(30) Foreign Application Priority Data

Sep. 2, 2014 (DE) ......................... 102014217507.0

(51) Int. Cl.

| | |
|---|---|
| ***F02M 61/16*** | (2006.01) |
| ***C23C 8/00*** | (2006.01) |
| ***C23C 8/24*** | (2006.01) |
| ***F02M 61/18*** | (2006.01) |

(Continued)

(52) U.S. Cl.

CPC ............. *F02M 61/166* (2013.01); *C23C 8/24* (2013.01); *C23C 8/30* (2013.01); *C23C 8/34* (2013.01);

(Continued)

(58) Field of Classification Search

CPC .... C23C 8/24; C23C 8/30; C23C 8/34; C23C 8/48; C23C 8/54; C23C 8/80; C23C 4/10;

(Continued)

(56) References Cited

U.S. PATENT DOCUMENTS

2007/0284255 A1‡ 12/2007 Gorokhovsky ....... C23C 14/024 205/89
2009/0078906 A1‡ 3/2009 Shafer .................... F02M 61/18 251/368

(Continued)

FOREIGN PATENT DOCUMENTS

EP 1150004 A2 ‡ 10/2001
EP 1150004 A2 10/2001

(Continued)

OTHER PUBLICATIONS

International Search Report dated Nov. 3, 2015, of the corresponding International Application PCT/EP2015/067484 filed Jul. 3, 2015.‡

*Primary Examiner* — Kelsey E Cary

(74) *Attorney, Agent, or Firm* — Norton Rose Fulbright US LLP; Gerard Messina

(57) ABSTRACT

A valve is provided, in particular an injection valve, having a valve seat and a valve needle which extends along a closing direction for the most part, the valve seat having a valve-seat surface, and a valve-closing element is mounted on an end of the valve needle facing the valve seat, the valve-closing element being able to be moved between an open position and a closed position, and the valve-closing element together with the valve-seat surface forming a sealing seat in the closed position, the valve-closing element having a greater core hardness and/or surface hardness than the valve-seat surface.

17 Claims, 3 Drawing Sheets

(51) Int. Cl.

| | |
|---|---|
| ***C23C 8/30*** | (2006.01) |
| ***C23C 8/48*** | (2006.01) |
| ***C23C 8/54*** | (2006.01) |
| ***C23C 8/80*** | (2006.01) |
| ***F02M 51/06*** | (2006.01) |
| ***C23C 8/34*** | (2006.01) |
| ***F02M 61/10*** | (2006.01) |

(52) U.S. Cl.
CPC .................. *C23C 8/48* (2013.01); *C23C 8/54* (2013.01); *C23C 8/80* (2013.01); *F02M 51/065* (2013.01); *F02M 61/10* (2013.01); *F02M 61/168* (2013.01); *F02M 61/18* (2013.01); *F02M 61/1886* (2013.01); *F02M 61/1893* (2013.01); *F02M 2200/02* (2013.01); *F02M 2200/9038* (2013.01); *F02M 2200/9061* (2013.01)

(58) Field of Classification Search
CPC ...... C23C 16/34; C23C 16/38; F02M 61/166; F02M 51/065; F02M 61/10; F02M 61/168; F02M 61/18; F02M 61/1886; F02M 61/1893
See application file for complete search history.

(56) References Cited

U.S. PATENT DOCUMENTS

2010/0001215 A1‡ 1/2010 Suzuki .............. F02M 51/0664 251/12
2010/0314005 A1‡ 12/2010 Saito ......................... C23C 8/26 148/318
2013/0220263 A1* 8/2013 Lehrkamp ............. C22C 38/001 123/188.3
2013/0239769 A1‡ 9/2013 Carlisle ................. C23C 16/448 83/651
2016/0097459 A1* 4/2016 Veliz ..................... F16K 25/005 123/188.14

FOREIGN PATENT DOCUMENTS

EP 1452717 A1 ‡ 9/2004
EP 1452717 A1 9/2004
JP H05196151 A ‡ 8/1993
JP H05196151 A 8/1993
JP H6346817 A ‡ 12/1994
JP H6346817 A 12/1994
JP H8188866 A ‡ 7/1996
JP H8188866 A 7/1996
JP H0985333 A ‡ 3/1997
JP H0985333 A 3/1997
JP H9209120 A ‡ 8/1997
JP H9209120 A 8/1997
JP 201014088 A 1/2010
JP 201014088 A ‡ 1/2010
WO 2005068825 A1 7/2005
WO WO-2005068825 A1 ‡ 7/2005
WO 2010116221 A1 10/2010
WO WO-2010116221 A1 ‡ 10/2010

* cited by examiner
‡ imported from a related application

VALVE AND METHOD FOR PRODUCING A VALVE

CROSS REFERENCE TO RELATED APPLICATIONS

The present application is a divisional application of U.S. patent application Ser. No. 15/327,209, filed on Jan. 18, 2017, which is a national phase to International Application No. PCT/EP2015/067484, filed Jul. 30, 2015, and claims priority to German Patent Application No. 10 2014 217 507.0, filed on Sep. 2, 2014, all of which are hereby incorporated by reference in their entireties.

BACKGROUND INFORMATION

Valves are used for the direct injection of automotive gasoline, in which case a valve ball cooperates with a valve seat so as to open or close the valve. The valve ball is connected to a needle and controlled by an actuator (such as a solenoid) with respect to a closing spring such that a specific quantity of fuel is selectively introduced into the combustion chamber. A disadvantage of such valve seats is that the tightness of the valve is adversely affected by valve wear.

SUMMARY

It is an object of the present invention to provide a valve and a method for producing a valve, in which wear of the closing components, in particular the ball and valve seat, is reduced and the tightness is increased so that the service life of the valve is extended in a relatively efficient manner.

A valve and method for producing a valve according to an example embodiment of the present invention may have the advantage of improving the tightness of the valve seat in comparison with the related art, so that no fuel emerges through leakage in the closed position, especially also after a relatively long operating period of the valve. In this manner it is therefore advantageously possible to prevent the seepage of uncombusted fuel residue into the combustion chamber and/or the entry of gases or air from the combustion engine into the valve. In addition, wear of further components such as valve orifices that produce the spray is avoided on account of the relatively high core hardness and/or surface hardness of the valve-closing element inasmuch as a form of the valve seat, in particular, remains largely unchanged during an operation of the valve. Preferably, a tribological system featuring an optimized material pairing, i.e., especially a material pairing having a predefined hardness difference, is realized by the valve-closing element and the valve-seat surface. The tribological contact partners (the valve-seat surface and the valve-closing element) in the sealing seat are preferably configured in such a way that the valve-seat surface (which in this instance is also referred as static contact partner) has a lower surface hardness and/or core hardness than the valve-closing element (which is also denoted as moved contact partner). For instance, the valve is an injection valve for the port injection or direct injection of fuel, in particular automotive gasoline.

Advantageous specific embodiments and further refinements of the present invention are described herein with reference to the figures.

According to a preferred further development, it is provided that the valve-seat surface is adapted to a form of the valve-closing element, the valve-closing element in particular having a spherical shape.

According to the present invention, this advantageously makes it possible to increase the sealing effect of the sealing seat in comparison with the related art in that the relatively hard valve-closing element works itself into a closing geometry of the valve seat and adapts the surfaces to one another. In particular the form of the valve-closing element is predefined in this case (i.e., is essentially unaffected by the valve-seat surface) so that the valve-seat surface is adapted to the predefined form of the valve-closing element.

According to another preferred further refinement, it is provided that the valve-closing element has a surface region, and in the closed position the valve-closing element is in contact with the valve-seat surface in the surface region, the valve-closing element having greater surface hardness in the surface region than the valve-seat surface.

According to the present invention, this advantageously makes it possible to realize a predefined or defined wear in the valve seat in the region of the valve-seat surface, in the course of which the valve-seat surface is modified only to a predefined degree by an initial breaking-in process of the valve needle.

According to another preferred further refinement, it is provided that the surface region of the valve-closing element includes a diffusion layer, and the diffusion layer in particular has a greater surface hardness than the valve-seat surface.

According to the present invention, this advantageously makes it possible to realize a relatively high increase in the hardness of the valve-closing element in comparison with the valve-seat surface.

According to another preferred further refinement, it is provided that the surface region includes a layer that is made of a coating material, the layer especially having a greater surface hardness than the valve-seat surface, and the layer being an amorphous carbon layer, in particular. According to another preferred further refinement, it is provided that a surface of the valve-closing element is at least partially, and preferably completely, made up of the layer.

According to the present invention, this advantageously makes it possible to achieve a relatively high sealing effect. For instance, the surface of the valve-closing element (i.e., in particular the layer of the valve-closing element exclusively) is additionally adapted to a valve-seat form of the valve-seat surface.

According to another preferred further refinement, it is provided that the layer has a coating thickness between 0 and 50 micrometers, preferably between 1 and 20 micrometers, and especially preferably, between 1.5 and 5 micrometers.

According to the present invention, this advantageously allows for a relative compensation of the tolerances through the relatively thin layer.

A further subject matter of the present invention is a method for producing a valve according to one specific embodiment of the present invention, which is characterized by the fact that the valve-closing element is produced from a base body material in a first production step, the valve-closing element is nitrified in a second production step, and the valve-closing element is boronized in a third production step.

According to the present invention, this advantageously makes it possible to realize an increase in the hardness of the valve-closing element in comparison with the valve seat, whereby marginal conditions such as the joinability (e.g., welding), corrosion resistance, low costs, robustness with respect to deposits (e.g., nonstick effect) and the retaining of the molding accuracy (especially of the valve seat and/or the surrounding function-relevant areas), in particular, are taken into account. Preferably, the valve is finished in a breaking-in step, in which the relatively hard valve-closing element works itself into a closing geometry of the valve seat and adapts the surfaces (of the valve-seat surface and the valve-closing element) to one another. It is advantageously possible, in particular, to subject the valve-closing element as bulk goods to an after-treatment, so that the after-treatment is achieved at relatively low expense. This advantageously realizes a surface hardening of the valve-closing element, the valve in particular being produced by a nitrating method, boronizing method and/or a kolsterising method. The nitrification on the valve-closing element preferably takes place with the aid of gas nitriding, plasma nitriding, high-pressure nitration hardening (e.g., in a gaseous state) or in a molten salt bath (i.e. in a liquid state). For example, the kolsterisation (i.e. diffusion of carbon in the gaseous state) is combined with gas nitriding (nitro-carburizing) or plasma nitro-carburizing.

On the ball, plasma nitriding advantageously constitutes an excellent option. The nitriding depth may be selected between 5 and 50 pm, but nitriding depths between 10 and 20 pm are sufficient as well. The boronizing is able to be applied by powder boronizing on the ball. A sufficient hardness is also able to be represented by a boronizing layer of 15-30 pm.

According to a preferred further refinement of the method of the present invention, it is provided to coat the valve-closing element with the coating material in a fourth production step, so that the layer made of the coating material is formed in the surface region of the valve-closing element.

According to the present invention, this advantageously makes it possible to realize a relatively high sealing effect; in addition, for example, the surface of the valve-closing element (i.e., in particular the layer of the valve-closing element exclusively) is adapted to a valve-seat form of the valve-seat surface.

According to another preferred further refinement of the method of the present invention, it is provided that the valve-closing element is nitrified in the second production step in such a way that a nitriding depth amounts to between 1 and 100 micrometers, preferably between 5 and 50 micrometers, and especially preferably, between 10 and 20 micrometers.

According to the present invention, this advantageously makes it possible to realize a relatively hard diffusion layer in comparison with the valve-seat surface.

According to another preferred further development of the method of the present invention, it is provided to generate a boration layer in the third production step so that the boration layer has a boration thickness between 1 and 100 micrometers, preferably between 5 and 90 micrometers, and especially preferably, between 15 and 30 micrometers.

According to the present invention, this advantageously makes it possible to realize a relatively wear-resistant boration layer.

Exemplary embodiments of the present invention are shown in the figures and described in greater detail below.

DETAILED DESCRIPTION OF EXAMPLE EMBODIMENTS

Figure 1:
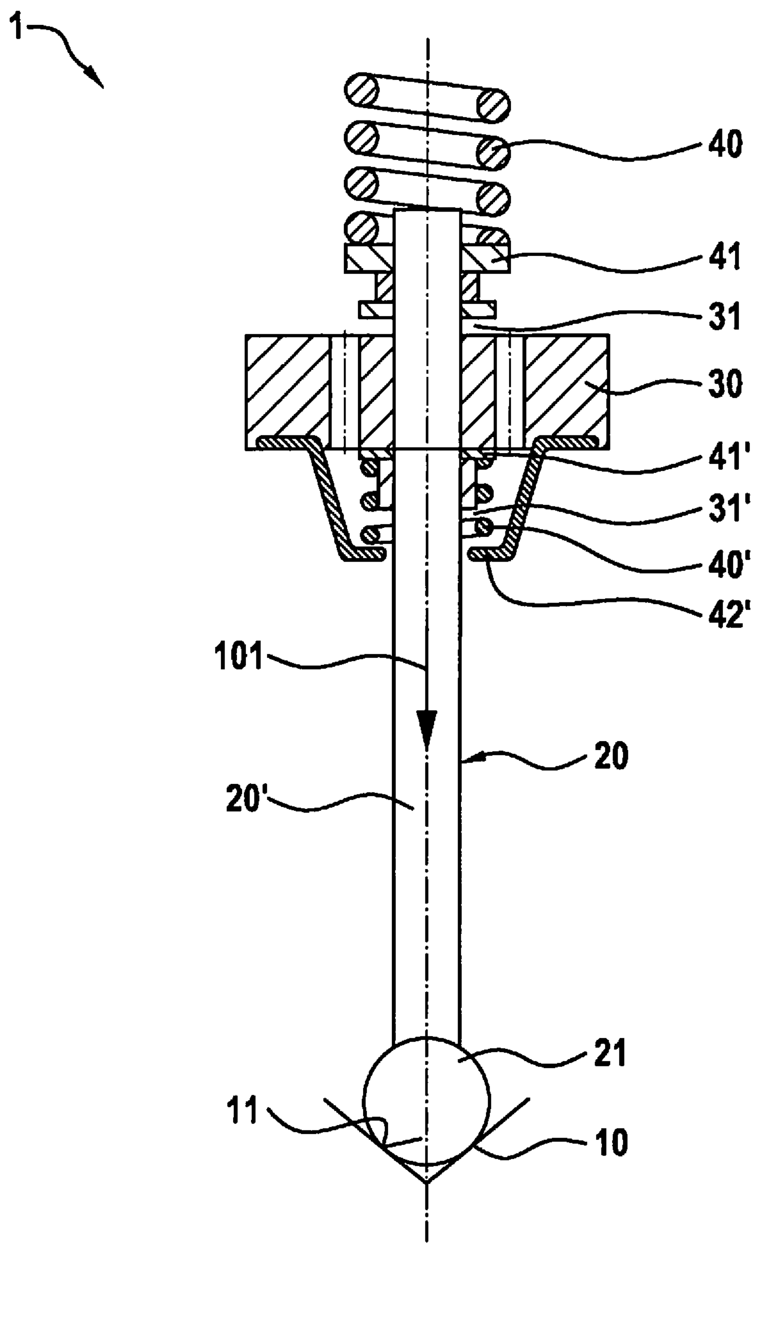
FIGS. 1 through 5 show a valve according to different specific embodiments of the present invention in a schematic cross-sectional view.

In all instances, identical components have been provided with the same reference numerals in the various figures and thus are generally also identified or mentioned only once.

FIG. 1 shows a valve 1 according to one specific embodiment of the present invention in a schematic cross-sectional view. In particular, valve 1 shown here is an injection valve for the injection of fuel into a combustion chamber (not shown). Valve 1 includes a valve seat 10 and a valve needle 20 which extends along a closing direction 101 for the most part. A valve-closing element 21, such as a valve-closing ball, is mounted on an end of valve needle 20 facing valve seat 10. In other words, valve needle 20 in particular includes valve-closing element 21 and a valve-needle base body 20' to which valve-closing element 21 is welded. Valve-closing element 21 is able to be moved between an open position and a closed position. In this instance, the valve is shown in a closed position of valve-closing element 21. Valve seat 10 has a valve-seat surface 11, which forms a sealing seat together with valve-closing element 21 in the closed position of valve-closing element 21. Moreover, the valve in particular includes a restoring spring 40, which is configured in such a way that valve-closing element 21 is moved from the open position to the closed position and is retained in the closed position until a magneto armature 30 of valve 1 lifts valve needle 20 off, counter to a spring force of restoring spring 40. During the opening of valve 1, the armature is preferably first accelerated along a free armature travel 31 and then strikes a stop element 41 so that valve-closing element 21 is moved from the closed position into the open position. In addition, FIG. 1 exemplarily illustrates a further restoring spring 40', a further stop element 41' and a further armature free travel 31' for a closing operation of valve 1. In particular, valve 1 has a spring cup 42' in this instance.

For example, valve-closing element 21 is a valve ball which sits on valve seat 10 having a conical geometry and thereby forms the sealing seat. A contact region between valve-closing element 21 and a valve-seat surface 11 of valve seat 10 in particular is linear and the the contact region is enlarged by wear, for example.

Figure 2:
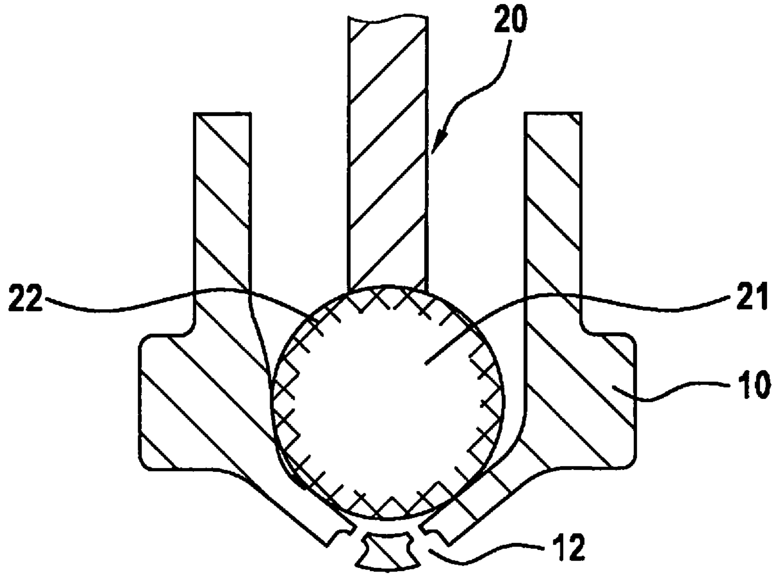

FIG. 2 shows a schematic cross-sectional view of a valve 1 according to a specific embodiment of the present invention; the specific embodiment shown here is essentially identical with the specific embodiment according to FIG. 1. According to the present invention, it is provided that valve-closing element 21 has a greater core hardness and/or surface hardness than valve-seat surface 11, so that a valve 1 is provided which has relatively low wear and/or has only a predefined wear. In an advantageous manner, this particularly makes it possible to place a predefined number and/or a predefined size of spray-discharge orifices 12 downstream from the sealing seat up to a wear region in the sealing seat, which, however, are not adversely affected by wear of the valve seat or are affected relatively little by such wear. FIG. 2 shows a valve-closing element 21 which was produced in a diffusion-method step and includes a diffusion layer 22. This advantageously realizes surface hardening of valve-closing element 21, the diffusion method in particular including a nitriding method, boration method and/or a kolsterization method. In the diffusion-method step, a certain substance in a gaseous state, in a plasma state or in a liquid state preferably diffuses into a material surface of valve-closing element 21 and forms a relatively hard diffusion layer 22. In an advantageous manner, this particularly allows for the realization of a surface hardness and/or corrosion resistance in a predefined manner and for a selective weldability of valve-closing element 21 on valve-needle base element 20'. According to the present invention, it is preferably provided that valve-closing element 21 has a support hardness for realizing a material pairing that features a predefined hardness difference so that in particular a hardness of valve-closing element 21 is greater than a hardness of valve seat 10. For instance, valve-closing element 21 has a relatively hard solid material so that greater core hardness and/or surface hardness of valve-closing element 21 is realized in comparison with valve seat 10 (at least in the area of the sealing seat). For instance, valve-closing base element 21 is produced from titanium, ceramics, tungsten or from an alloy that includes titanium, ceramics or tungsten or another material.

Figure 3:
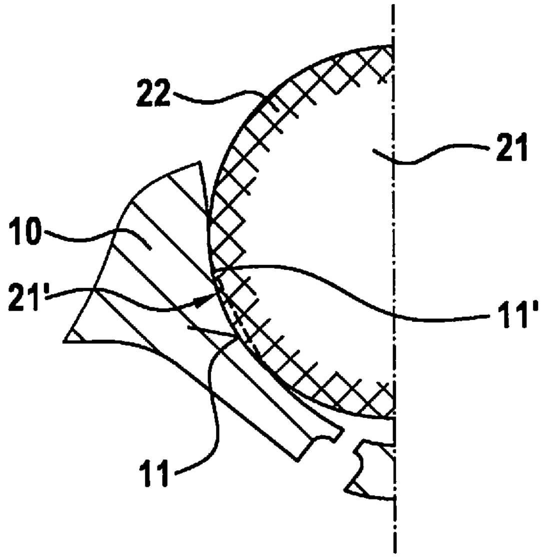

FIG. 3 shows a schematic cross-sectional view of a valve 1 according to a specific embodiment of the present invention; in particular, the specific embodiment shown here is essentially identical with one of the preceding specific embodiments, but in this case, valve-seat surface 11 is adapted to a form (in particular to a surface in a surface region 21') of valve-closing element 21. Here, a state of valve 1 prior to and after the breaking-in process (see reference numerals 11 and 11') is illustrated; during the breaking-in process, valve-closing element 21 penetrates valve seat 10 to such an extent that a defined or predefined wear is generated in the region of the sealing seat. This advantageously makes it possible for valve seat 10 to realize a damping effect during the closing of valve 1, and a noise level during the closing of valve 1 is reduced, in particular, in comparison with the related art.

Figure 4:
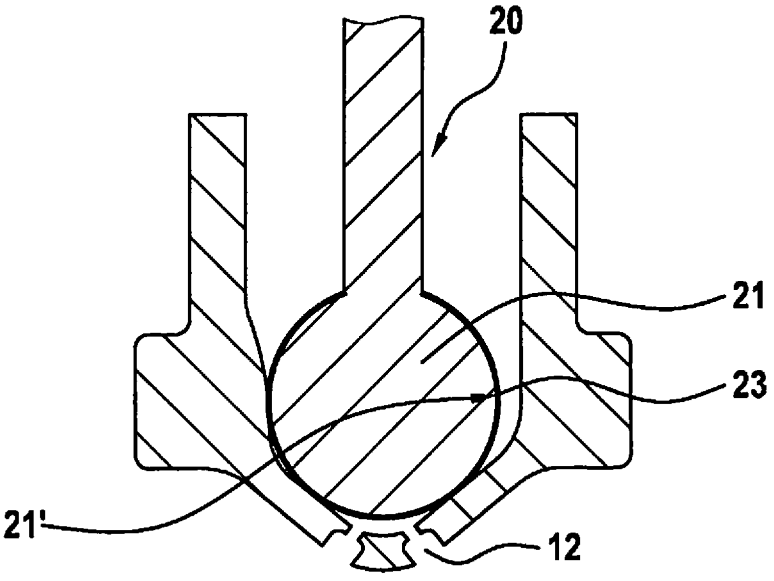

FIG. 4 shows a schematic cross-sectional view of a valve 1 according to one specific embodiment of the present invention. In particular, the specific embodiment shown here is essentially identical with one of the preceding specific embodiments, and a layer 23 is depicted, which is situated in a surface region 21' of valve-closing element 21 in this case. Here, layer 23 forms a surface of valve-closing element 21. The layer is an amorphous carbon layer (DLC: diamond-like carbon), for instance, or a titanium layer (such as a titanium-aluminum-nitride layer). Preferably, layer 23 is configured in such a way that layer 23 is subject to wear itself (i.e. is adapted to the valve-seat form of valve seat 10) so that valve-seat surface 11 itself is not deformed by layer 23. In this way, a relatively high tightness of the sealing seat is advantageously realized. In this case, a main portion of the surface of valve-closing element 21 is provided with layer 23.

Figure 5:
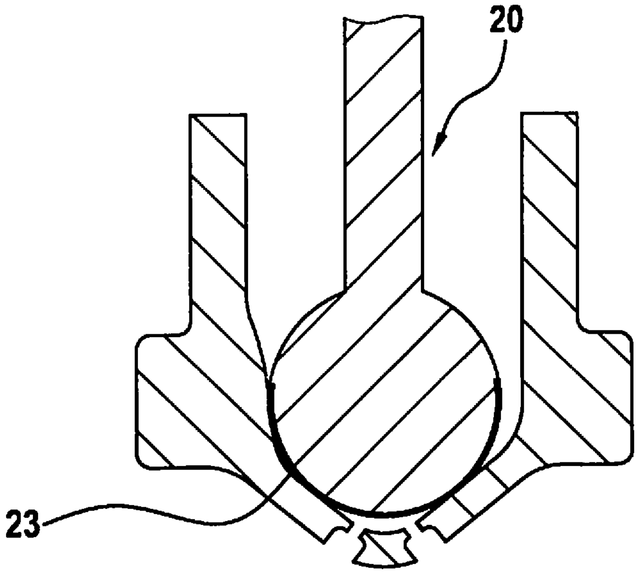

FIG. 5 shows a schematic cross-sectional view of a valve 1 according to a specific embodiment of the present invention; in particular, the specific embodiment shown here is essentially identical with one of the preceding specific embodiments, and valve-closure element 21 is partially coated in this case. Valve-closing element 21 is preferably coated in such a way that valve-closing element 21 includes layer 23 in a region that faces valve seat 10. Especially preferably, the region facing valve seat 10 includes a sealing region (to form the sealing seat) and/or a guide region and/or further tribologically stressed regions.

What is claimed is:

1. An injection valve, comprising:

a valve seat having a valve-seat surface; and a valve needle which extends along a closing direction, a valve-closing element being mounted on an end of the valve needle facing the valve seat, the valve-closing element being able to be moved between an open position and a closed position, the valve-closing element forming a sealing seat together with the valve-seat surface in the closed position;

wherein the valve-closing element has at least one of: i) a greater core hardness than the valve-seat surface, or ii) a greater surface hardness than the valve-seat surface; and wherein the valve-closing element includes a base body material and at least one diffusion layer with nitrogen and boron diffused into the base body material, the at least one diffusion layer being produced by (i) conducting a nitrifying diffusion on the valve-closing element, the nitrifying diffusion including diffusing nitrogen into the base body material by providing a nitrogen-containing substance in at least one of: a gaseous state, a liquid state, or a plasma state; and (ii) conducting a boronizing diffusion on the valve-closing element, the boronizing diffusion including diffusing boron into the base body material by providing a boron-containing substance in at least one of: a gaseous state, a liquid state, or a plasma state.

2. The valve as recited in claim 1, wherein the valve-seat surface is adapted to a form of the valve-closing element, and the valve-closing element has a spherical form.

3. The valve as recited in claim 1, wherein the valve-closing element has a surface region and in the closed position, the valve-closing element is in contact with the valve-seat surface in the surface region, the valve-closing element having a greater surface hardness in the surface region than the valve-seat surface.

4. The valve as recited in claim 3, wherein the surface region of the valve-closing element includes the diffusion layer, and the diffusion layer has a greater surface hardness than the valve-seat surface.

5. The valve as recited in claim 3, wherein the surface region includes a layer made of a coating material, the layer having a greater surface hardness than the valve-seat surface, the layer being an amorphous carbon layer.

6. The valve as recited in claim 5, wherein a surface of the valve-closing element is at least partially made up of the layer.

7. The valve as recited in claim 5, wherein the layer has a coating thickness between 0 and 50 micrometers.

8. The valve as recited in claim 5, wherein the layer has a coating thickness between 1 and 20 micrometers.

9. The valve as recited in claim 5, wherein the layer has a coating thickness between 1.5 and 5 micrometers.

10. The valve as recited in claim 1, wherein the valve-closing element includes a body formed from the base body material.

11. The valve as recited in claim 1, wherein a center of the valve-closing element is formed from the base body material.

12. The valve as recited in claim 1, wherein the nitrogen is diffused into the base body material in the at least one diffusion layer to a depth of between 1 and 100 micrometers.

13. The valve as recited in claim 1, wherein the nitrogen is diffused into the base body material in the at least one diffusion layer to a depth of between 5 and 50 micrometers.

14. The valve as recited in claim 1, wherein the nitrogen is diffused into the base body material in the at least one diffusion layer to a depth of between 10 and 20 micrometers.

15. The valve as recited in claim 1, wherein the boron is diffused into the base body material in the at least one diffusion layer to a depth of between 1 and 100 micrometers.

16. The valve as recited in claim 1, wherein the boron is diffused into the base body material in the at least one diffusion layer to a depth of between 5 and 90 micrometers.

17. The valve as recited in claim 1, wherein the nitrogen is diffused into the base body material in the at least one diffusion layer to a depth of between 15 and 30 micrometers.

* * * * *